(12) United States Patent
Lee

(10) Patent No.: US 8,759,823 B2
(45) Date of Patent: Jun. 24, 2014

(54) ARRAY SUBSTRATE AND METHOD OF FABRICATING THE SAME

(71) Applicant: LG Display Co., Ltd., Seoul (KR)

(72) Inventor: Jung-Eun Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/707,141

(22) Filed: Dec. 6, 2012

(65) Prior Publication Data

US 2013/0228756 A1 Sep. 5, 2013

(30) Foreign Application Priority Data

Mar. 5, 2012 (KR) .......................... 10-2012-0022562

(51) Int. Cl.
*H01L 51/10* (2006.01)
*H01L 29/786* (2006.01)
*H01L 27/32* (2006.01)
*H01L 51/52* (2006.01)
*H01L 51/05* (2006.01)
*H01L 51/56* (2006.01)

(52) U.S. Cl.
CPC ............ *H01L 51/52* (2013.01); *H01L 27/3274* (2013.01); *H01L 27/3258* (2013.01); *H01L 51/56* (2013.01); *H01L 51/0541* (2013.01); *H01L 51/0529* (2013.01)
USPC ...................... 257/40; 257/E51.007; 438/151

(58) Field of Classification Search
None
See application file for complete search history.

(56) References Cited

U.S. PATENT DOCUMENTS

| 2007/0120116 | A1* | 5/2007 | Han ................................ 257/40 |
| 2008/0121875 | A1* | 5/2008 | Kim ................................ 257/40 |
| 2010/0053486 | A1* | 3/2010 | Shim et al. ...................... 349/39 |
| 2011/0143285 | A1* | 6/2011 | Lim et al. ....................... 430/316 |
| 2013/0228756 | A1* | 9/2013 | Lee, Jung-Eun ................ 257/40 |

FOREIGN PATENT DOCUMENTS

| JP | H10-221705 A | 8/1998 |
| JP | 2006-117958 A | 5/2006 |
| JP | 2006-344926 A | 12/2006 |
| JP | 2007-150240 A | 6/2007 |
| JP | 2010-283332 A | 12/2010 |

OTHER PUBLICATIONS

Han, S-H., et. al. "Passivation of High-Performance Pentacene TFT on Plastic" J. of Korean Physical Society, vol. 48, Jan. 2006 pp. S107-S110.*
Japanese Patent Office, Office Action, Japanese Patent Application No. 2012-258222, Jan. 23, 2014, ten pages.

* cited by examiner

*Primary Examiner* — Davienne Monbleau
*Assistant Examiner* — Joseph Schoenholtz
(74) *Attorney, Agent, or Firm* — Fenwick & West LLP

(57) ABSTRACT

A fabricating method of an array substrate includes forming source and drain electrodes in each of pixel regions on a substrate; forming an organic semiconductor layer and a gate insulating layer on the source and drain electrodes, the organic semiconductor layer having an island shape and contacting facing ends of the source and drain electrodes, the gate insulating layer having a same plane shape as the organic semiconductor layer; forming a first passivation layer on the gate insulating layer; forming a gate electrode on the first passivation layer in the pixel region, the gate electrode corresponding to the gate insulating layer; forming a second passivation layer on the gate electrode, the second passivation layer having a drain contact hole exposing the drain electrode; and forming a pixel electrode on the second passivation layer, the pixel electrode contacting the drain electrode through the drain contact hole.

15 Claims, 18 Drawing Sheets

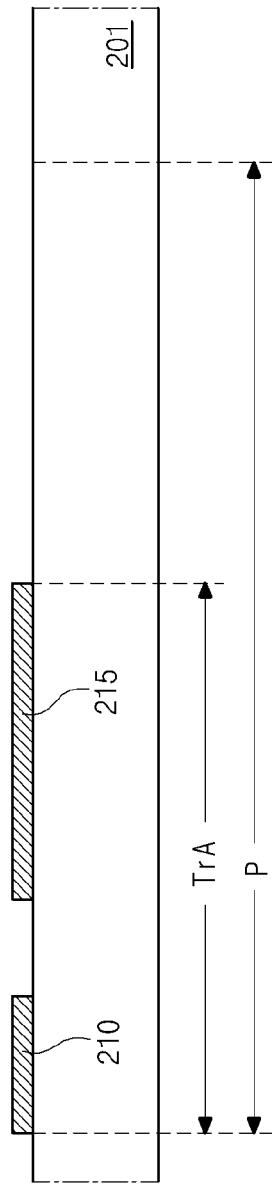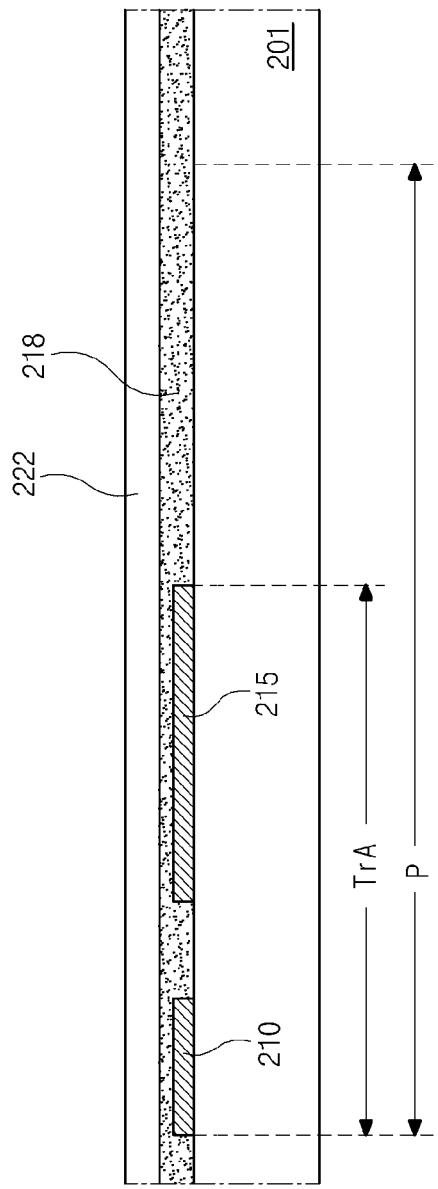

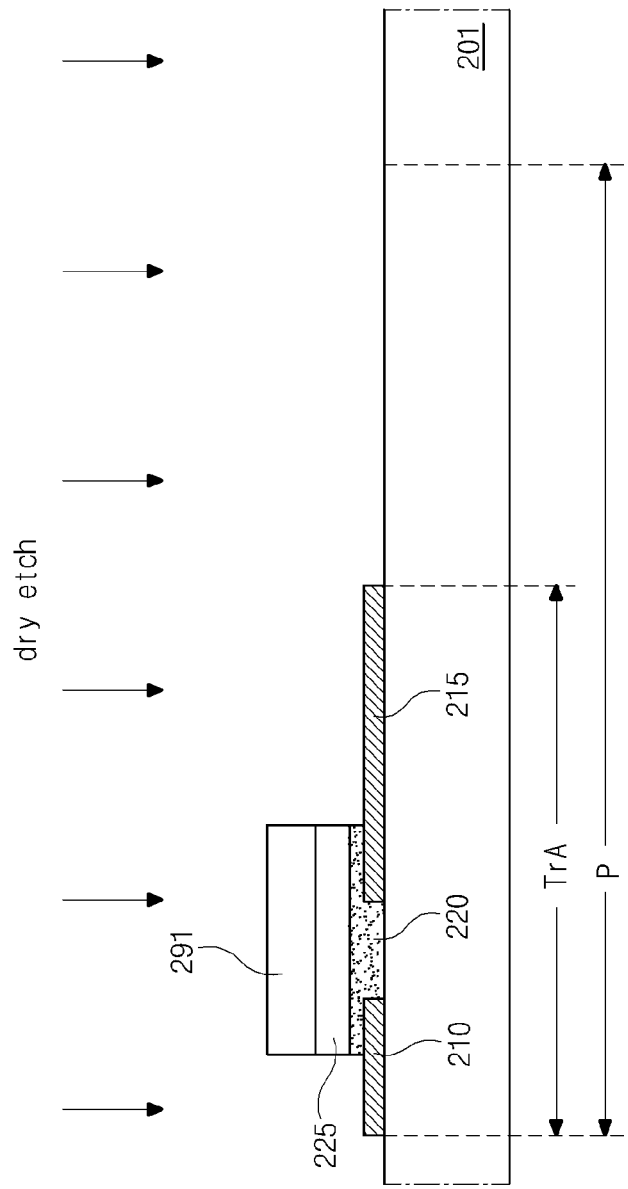

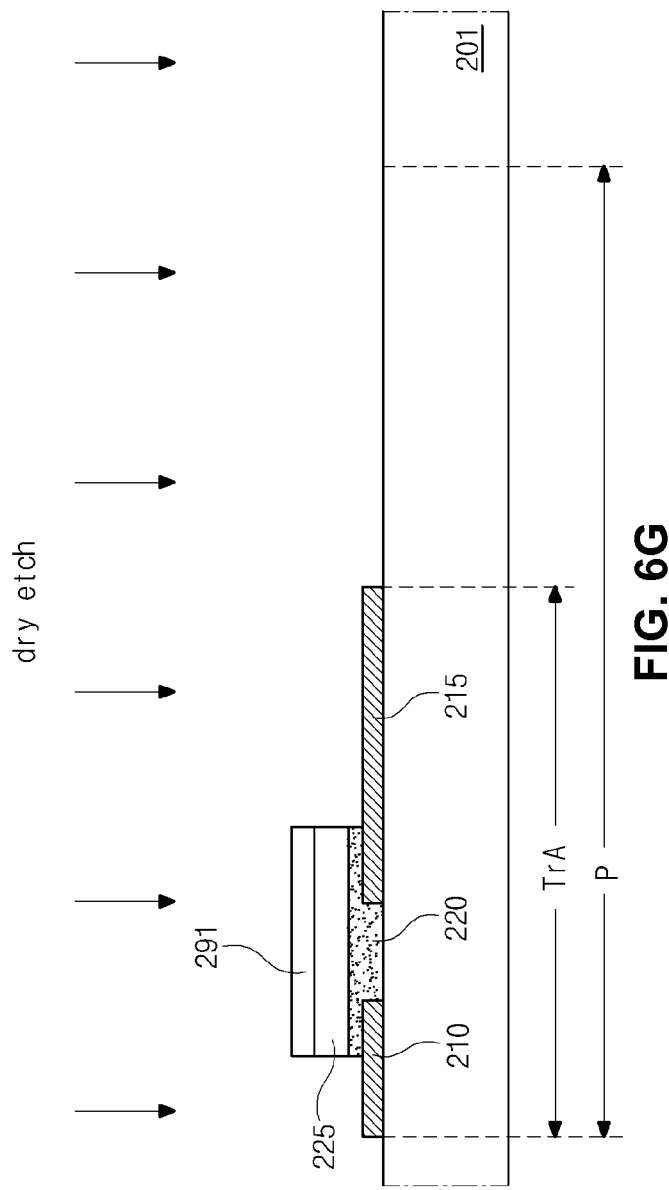

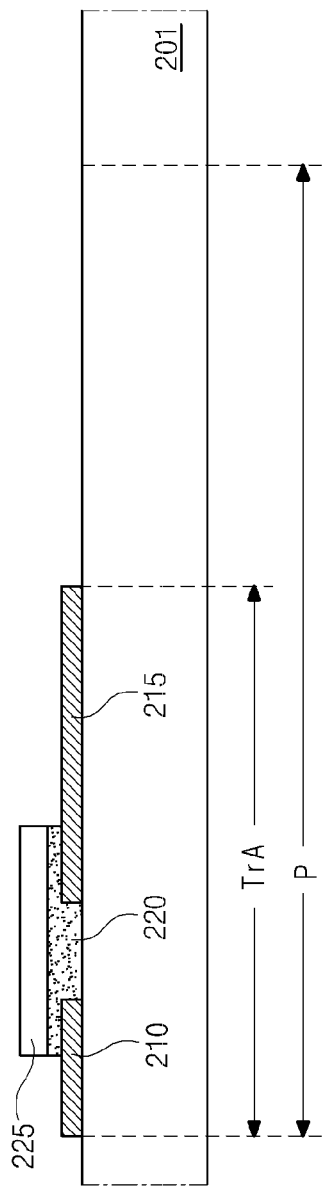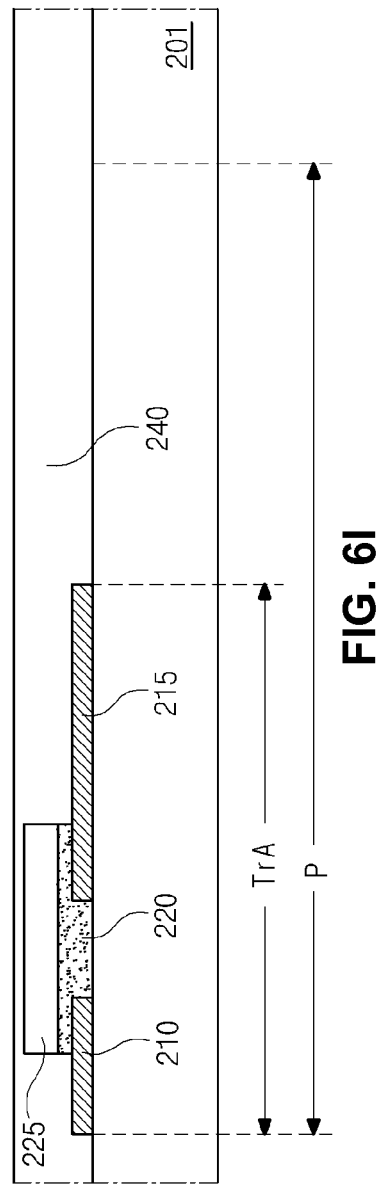

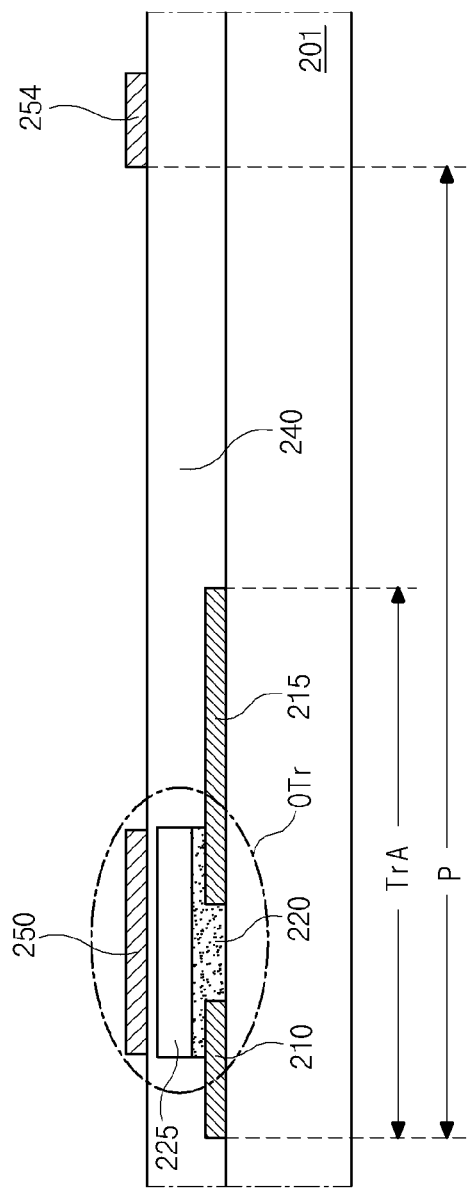

ARRAY SUBSTRATE AND METHOD OF FABRICATING THE SAME

CROSS-REFERENCE TO RELATED APPLICATION(S)

The application claims the benefit of Korean Patent Application No. 10-2012-0022562 filed in Republic of Korea on Mar. 5, 2012, which is hereby incorporated by reference for all purposes as if fully set forth herein.

BACKGROUND

1. Field of the Disclosure

The disclosure relates to a display device, and more particularly, to an array substrate for a display device including an organic thin film transistor that has an organic semiconductor layer and a method of fabricating the same.

2. Discussion of the Related Art

With rapid development of information technologies, display devices for displaying a large amount of information have been promptly developed. More particularly, flat panel display (FPD) devices having a thin profile, light weight and low power consumption such as organic electroluminescent display (OLED) devices and liquid crystal display (LCD) devices have been actively pursued and are replacing the cathode ray tubes (CRTs).

Among the liquid crystal display devices, active matrix type liquid crystal display devices, which include thin film transistors to control on/off respective pixels, have been widely used because of their high resolution, color rendering capability and superiority in displaying moving images.

In addition, organic electroluminescent display devices have been recently spotlighted because they have many merits as follows: the organic electroluminescent display devices have high brightness and low driving voltages; because they are self-luminous, the organic electroluminescent display devices have excellent contrast ratios and ultra thin thicknesses; the organic electroluminescent display devices have a response time of several micro seconds; there are advantages in displaying moving images; the organic electroluminescent display devices have wide viewing angles and are stable under low temperatures; and since the organic electroluminescent display devices are driven by a low voltage of direct current (DC) 5V to 15V, it is easy to design and manufacture driving circuits.

Each of the active matrix type liquid crystal display devices and the active matrix type organic electroluminescent display devices includes an array substrate having thin film transistors as switching elements to control on/off their respective pixels.

FIG. 1 is an exploded perspective view of an LCD device, which is one of the flat panel display devices.

As shown in FIG. 1, the LCD device includes an array substrate 10, a color filter substrate 20 and a liquid crystal layer 30. The array substrate 10 and the color filter substrate 20 face each other, and the liquid crystal layer 30 is interposed therebetween.

The array substrate 10 includes a first transparent substrate 12 and gate lines 14 and data lines 16 on an upper surface of the first transparent substrate 12. The gate lines 14 and the data lines 16 cross each other such that regions formed between the gate and data lines 14 and 16 are defined as pixel regions P. A thin film transistor Tr is formed at each crossing portion of the gate and data lines 14 and 16, and a pixel electrode 18 is formed in each pixel region P and connected to the thin film transistor Tr.

The color filter substrate 20 includes a second transparent substrate 22 and a black matrix 25, a color filter layer 26, and a common electrode 28 on a rear surface of the second transparent substrate 22 facing the array substrate 10. The black matrix 25 has a lattice shape to shield a non-display area such as the gate lines 14, the data lines 16, the thin film transistors Tr, and so on. The color filter layer 26 includes red, green and blue color filter patterns 26a, 26b, and 26c repeatedly arranged in order. Each of the color filter patterns 26a, 26b, and 26c corresponds to each pixel region P. The common electrode 28 is formed on the black matrix 25 and the color filter layer 26 and over an entire surface of the substrate 22.

Although not shown in the figure, a seal pattern is formed between the array substrate 10 and the color filter substrate 20 along their peripheries to prevent liquid crystal molecules of the liquid crystal layer 30 from leaking. An alignment layer (not shown) is formed between the liquid crystal layer 30 and each of the array substrate 10 and the color filter substrate 20 to determine an initial direction of the liquid crystal molecules. First and second polarizers (not shown), which have respective polarization axes perpendicular to each other, are disposed on outer surfaces of the array substrate 10 and the color filter substrate 20, respectively. A backlight unit (not shown) is disposed over an outer surface of the array substrate 10 to provide light.

Scan signals for turning on/off the thin film transistors Tr are sequentially applied to the gate lines 14, and data signals are applied to the pixel electrodes 18 in the selected pixel regions P through the data lines 16. An electric field perpendicular to the substrates 12 and 22 is induced between the pixel electrodes 18 and the common electrode 28. The arrangement of the liquid crystal molecules is controlled by the electric field, and the transmittance of light is changed by varying the arrangement of the liquid crystal molecules to thereby display various images.

Meanwhile, in the LCD device having the above-mentioned structure, glass substrates have been commonly used for the first and second transparent substrates 12 and 22 of the array substrate 10 and the color filter substrate 20. Recently, LCD devices using plastic substrates, which are lighter than glass substrates and less broken due to their flexibility, have been needed as small portable devices such as notebook computers or personal digital assistants (PDAs) have been widely used.

However, to fabricate the array substrate, since many processes are performed under high temperatures more than 200 degrees of Celsius, there are difficulties in manufacturing the array substrate using the plastic substrate, which is less heat resistance and chemical resistance than a glass substrate.

In addition, when the signal lines and the pixels including thin film transistors are formed under relatively low temperatures less than 200 degrees of Celsius, forming metallic materials for the signal lines and electrodes and a passivation layer under lower temperatures does not affect characteristics of the thin film transistors. However, in case of the semiconductor layer in which a channel is formed as a path for carriers, if the semiconductor layer is formed by depositing amorphous silicon, which is generally used, under lower temperatures less than 200 degrees of Celsius, the inside structure of the semiconductor layer is not closely formed. As a result, important characteristics such as mobility in the semiconductor, etc. are rapidly lowered, whereby reliability of the thin film transistor is declined.

Thus, generally, a plastic substrate has been used for the color filter substrate of the upper substrate, and a common glass substrate has been used for the array substrate of the lower substrate.

For the same reason, in an organic electroluminescent display device, a glass substrate has been generally used for an array substrate which includes thin film transistors of switching elements and driving elements.

Therefore, to overcome these problems, an array substrate including a thin film transistor having an organic semiconductor layer instead of amorphous silicon has been suggested. Even though the organic semiconductor layer is formed under lower temperatures less than 200 degrees of Celsius, the organic semiconductor layer has superior reliabilities.

Fabricating an array substrate including a thin film transistor having an organic semiconductor layer is not limited to a plastic substrate but can be applied to a glass substrate.

Hereinafter, a structure of an array substrate including an organic semiconductor layer will be described. Here, the organic semiconductor layer is formed under lower temperatures less than 200 degrees of Celsius.

FIG. 2 is a cross-sectional view of a pixel region of an array substrate including a thin film transistor having an organic semiconductor layer of the related art.

As shown in FIG. 2, in an array substrate including a thin film transistor OTr having an organic semiconductor layer 120 of the related art, source and drain electrodes 110 and 115 are formed in each pixel region P on an insulating substrate 101 and spaced apart from each other. An organic semiconductor layer 120 of an island shape is formed to correspond to an area between the source and drain electrodes 110 and 115. A data line (not shown) is also formed on the insulating substrate 101. The data line is connected to the source electrode 110 and extends along a direction.

A gate insulating pattern 125 and a first gate electrode 130 are formed on the organic semiconductor layer 120. The gate insulating pattern 125 and the first gate electrode 130 have the same plane shape as the organic semiconductor layer 120.

A first passivation layer 140 is formed of an organic insulating material and covers the first gate electrode 130. The first passivation layer has a gate contact hole 143 exposing the first gate electrode 130 and a first hole 145 exposing the drain electrode 115. A second gate electrode 150 and an auxiliary pattern 152 are formed on the first passivation layer 140. The second gate electrode 150 contacts the first gate electrode 130 through the gate contact hole 143, and the auxiliary pattern 152 contacts the drain electrode 115 through the first hole 145.

A gate line 154 is formed on the first passivation layer 140 and is connected to the second gate electrode 150.

A second passivation layer 160 covers the second gate electrode 150 and the gate line 154 and has a second hole 163 exposing the auxiliary pattern 152. A pixel electrode 170 is formed on the second passivation layer 160 in each pixel region P and contacts the auxiliary pattern 152 connected to the drain electrode 115 through the second hole 163.

In the array substrate including the thin film transistor OTr having the organic semiconductor layer 120 of the related art, an organic semiconductor material of the organic semiconductor layer 120 is very vulnerable to developer for patterning photoresist or etchant for etching metallic materials. Specially, if a portion for the channel between the source and drain electrodes 110 and 115 is exposed to the developer or the etchant, characteristics of the transistor may be severely degraded. To prevent this, the gate insulating pattern 125 and the first gate electrode 130 are formed on the organic semiconductor layer 120 to have the same plane shape as the organic semiconductor layer 120.

More particularly, in case that the organic semiconductor layer 120 of a certain shape is formed, the organic semiconductor material does not have a photosensitive property. Therefore, to pattern the organic semiconductor material, light-exposing, developing and etching processes using a photosensitive material should be performed. If the organic semiconductor material is exposed to developer for a photoresist, which is widely used in a patterning process, the inside structure of the organic semiconductor material is damaged. Thereby, semiconductor properties are lowered, a degradation speed is increased, and time for driving the transistor gets short. To prevent theses, the organic semiconductor layer 120, the gate insulating pattern 125 and the first gate electrode 130 are simultaneously formed through the same mask process.

Accordingly, in the array substrate including the thin film transistor OTr having the organic semiconductor layer 120 of the related art, the gate electrode is divided into the first and second gate electrodes 130 and 150, which are separately formed on different layers. This causes a raise in manufacturing costs, and manufacturing processes and time increase due to an additional process, thereby lowering productivity.

SUMMARY OF THE INVENTION

Accordingly, the present invention is directed to an array substrate for a display device and a method of manufacturing the same that substantially obviate one or more of the problems due to limitations and disadvantages of the related art.

An advantage of the present invention is to provide an array substrate including a thin film transistor having an organic semiconductor layer and a method of manufacturing the same that pattern the organic semiconductor layer without damages and include a single gate electrode, whereby costs for materials is reduced and manufacturing processes and time are decreased, thereby improving productivity.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of embodiments of the invention, as embodied and broadly described, a fabricating method of an array substrate includes forming source and drain electrodes in each of pixel regions on a substrate on which a display area including the pixel regions is defined; forming an organic semiconductor layer and a gate insulating layer on the source and drain electrodes, the organic semiconductor layer having an island shape and contacting facing ends of the source and drain electrodes, the gate insulating layer having a same plane shape as the organic semiconductor layer; forming a first passivation layer on the gate insulating layer all over the display area; forming a gate electrode on the first passivation layer in the pixel region, the gate electrode corresponding to the gate insulating layer; forming a second passivation layer on the gate electrode over all of the display area, the second passivation layer having a drain contact hole exposing the drain electrode; and forming a pixel electrode on the second passivation layer, the pixel electrode contacting the drain electrode through the drain contact hole.

In another aspect, an array substrate includes source and drain electrodes in each of pixel regions on a substrate on which a display area including the pixel regions is defined; an organic semiconductor layer and a gate insulating layer on the source and drain electrodes, the organic semiconductor layer having an island shape and contacting facing ends of the source and drain electrodes, the gate insulating layer having a same plane shape as the organic semiconductor layer; a first passivation layer on the gate insulating layer over all of the display area, the first passivation layer including a same material as the gate insulating layer; a gate electrode on the first passivation layer in the pixel region, the gate electrode corresponding to the gate insulating layer; a second passivation layer on the gate electrode over all of the display area, the second passivation layer having a drain contact hole exposing the drain electrode; and a pixel electrode on the second passivation layer, the pixel electrode contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6A to 6M are cross-sectional views of illustrating an array substrate in respective steps of the method of fabricating the same according to the exemplary embodiment of the present invention.

DETAILED DESCRIPTION OF THE PREFERRED EMBODIMENTS

Reference will now be made in detail to embodiments of the present invention, examples of which are illustrated in the accompanying drawings.

Figure 3A:
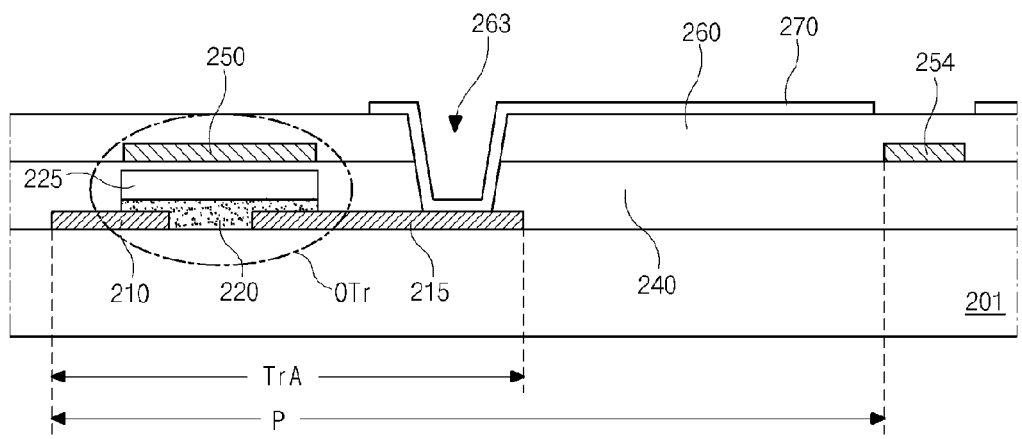
FIG. 3A and FIG. 3B are a cross-sectional view and a plan view of a pixel region of an array substrate including a thin film transistor having an organic semiconductor layer according to an exemplary embodiment of the present invention, respectively, and FIG. 3A corresponds to a cross-section taken along the line III-III of FIG. 3B.
Figure 3B:
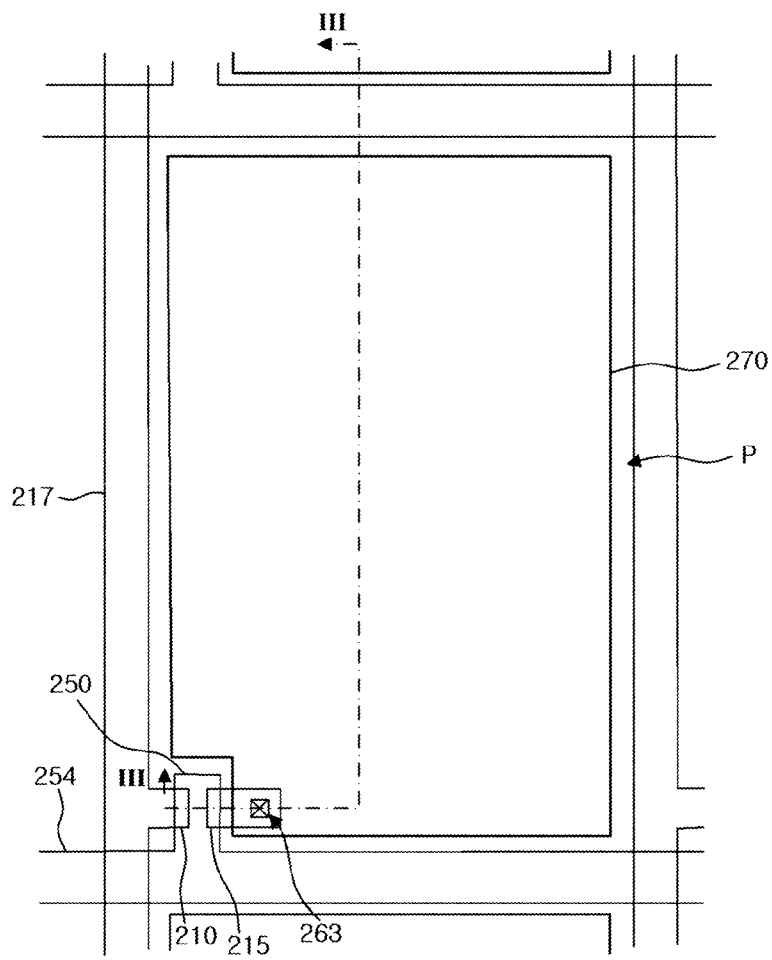

FIG. 3A is a cross-sectional view of a pixel region in a display area for displaying an image of an array substrate including a thin film transistor having an organic semiconductor layer according to an exemplary embodiment of the present invention. FIG. 3B is a plan view of a pixel region in a display area for displaying an image of an array substrate including a thin film transistor having an organic semiconductor layer according to an exemplary embodiment of the present invention. FIG. 3A corresponds to a cross-section taken along the line III-III of FIG. 3B. For convenience of explanation, an area where a thin film transistor OTr having an organic semiconductor layer 220 in each pixel region P is formed is referred to as a switching area TrA.

As shown in FIG. 3A and FIG. 3B, a data line 217 is formed on a transparent insulating substrate 201, for example, a plastic substrate or a glass substrate having flexibility, along a direction, and a source electrode 210 and a drain electrode 215 are formed in the switching area TrA on the insulating substrate 201. The source and drain electrodes 210 and 215 are spaced apart from each other, and the source electrode 210 extends from the data line 217.

An organic semiconductor layer 220 having an island shape is formed in the switching area TrA. The organic semiconductor layer 220 corresponds to an area between the source and drain electrodes 210 and 215 and contacts upper surfaces of facing ends of the source and drain electrodes 210 and 215 spaced apart from each other. The organic semiconductor layer 220 is formed of an organic semiconductor material, for example, pentacene or polythiophene.

A gate insulating layer 225 is formed on the organic semiconductor layer 220 in the switching area TrA. The gate insulating layer 225 has the same plane area as the organic semiconductor layer 220. The gate insulating layer 225 is formed of a material expressed by the following structural formula (hereinafter, referred to as an OGI (organic gate insulator) material):

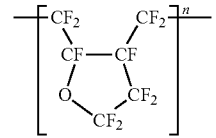

It is noted that the material for the gate insulating layer 225 and the first passivation layer 240 are not limited by the OGI material. For example, one of PI (polyimide), PVP (Poly 4-vinylphenol), PVA (Polyvinyl alcohol), PMMA (poly(m-ethyl methacrylate)), BCB (benzocyclobutene), Polypropylene, etc. may be used for the gate insulating layer 225 and the first passivation layer 240.

In the array substrate including the thin film transistor OTr having the organic semiconductor layer 220 according to the exemplary embodiment of the present invention, the first gate electrode of the related art, which is disposed on and in contact with the gate insulating layer, is omitted.

Nonetheless, a channel portion of the organic semiconductor layer 220 is not damaged by developer or etchant, and the organic semiconductor layer 220 has superior semiconductor properties. This will be described in detail later.

A first passivation layer 240 is formed on the gate insulating layer 225 all over the display area. A gate line 254 and a gate electrode 250 are formed on the first passivation layer 240. The gate line 254 crosses the data line 217 to define the pixel region P. The gate electrode 250 is disposed in the switching area TrA and is connected to the gate line 254.

The source and drain electrodes 210 and 215, the organic semiconductor layer 220, the gate insulating layer 225, the first passivation layer 240 and the gate electrode 250, which are sequentially layered in the switching area TrA, constitute a thin film transistor OTr of a switching element.

Even though the array substrate having the above-mentioned structure according to the exemplary embodiment of the present invention includes the organic semiconductor layer 220, the gate electrode 250 is formed only on the first passivation layer and is different from the related art where two gate electrodes are formed as different layers. Thus, a process for forming an additional gate electrode can be omitted and manufacturing costs can be decreased as compared with the related art.

Next, a second passivation layer 260 is formed on the gate electrode 250 and the gate line 254 all over the display area. At this time, a drain contact hole 263 is formed in the second passivation layer 260 and the first passivation layer 240 thereunder. The drain contact hole 263 exposes an upper surface of a part of the drain electrode 215 in the pixel region P.

A pixel electrode 270 of a transparent conductive material is formed on the second passivation layer 260 having the drain electrode 273 in the pixel region P and has a plate shape.

The array substrate including the thin film transistor OTr having the organic semiconductor layer 220 according to the exemplary embodiment of the present invention may be used as an array substrate for a twisted nematic (TN) mode LCD device.

Figure 4A:
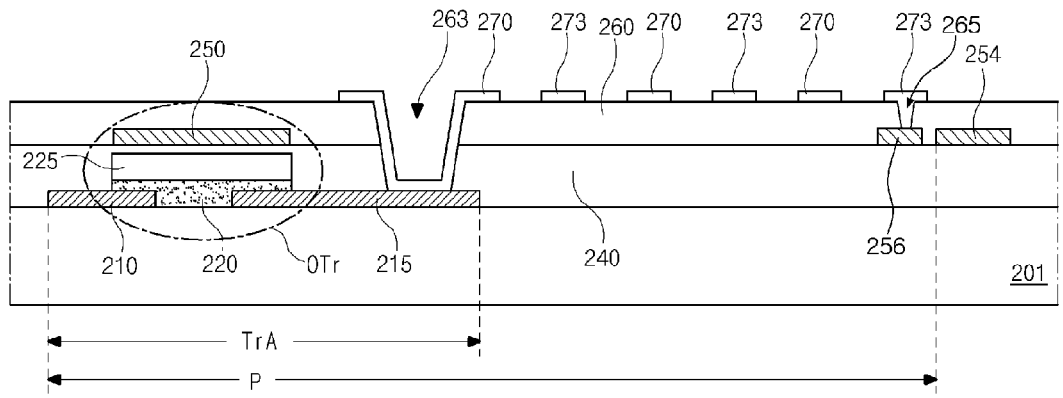
FIG. 4A and FIG. 4B are a cross-sectional view and a plan view of a pixel region of an array substrate including a thin film transistor having an organic semiconductor layer according to another example of the present invention, respectively, and FIG. 4A corresponds to a cross-section taken along the line IV-IV of FIG. 4B.
Figure 4B:
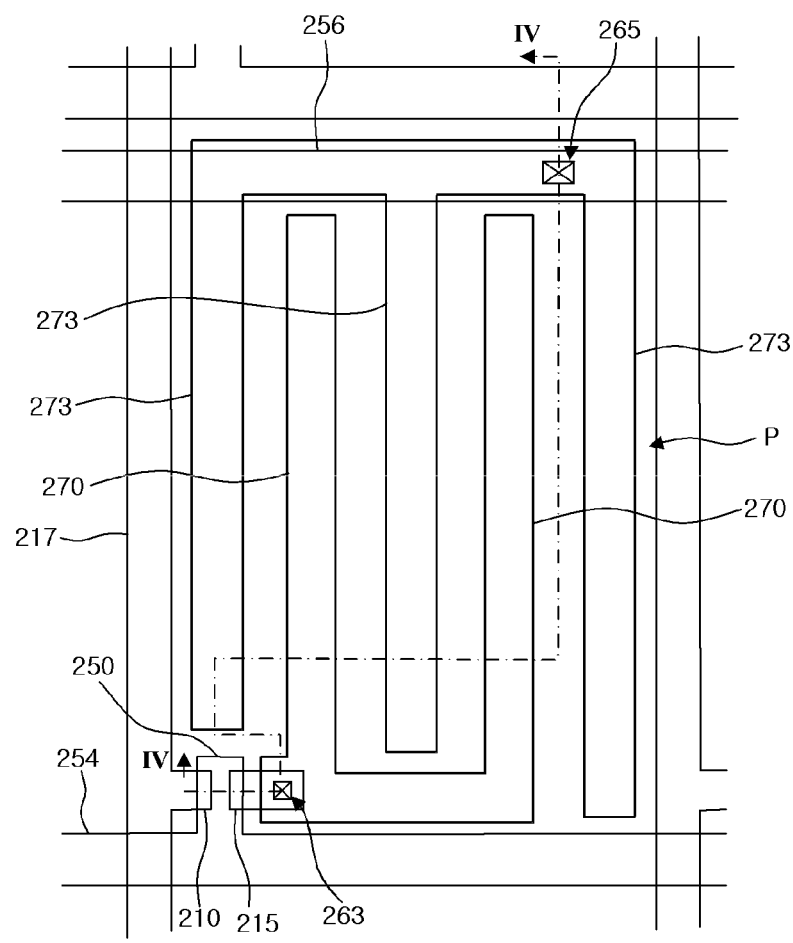

As another example, the array substrate can be applied to an in-plane switching (IPS) mode LCD device. In this case, as shown in FIG. 4A and FIG. 4B, the pixel electrode 270 includes bar-shaped patterns in the pixel region P, and a common electrode 273 including bar-shaped patterns, which alternate with the patterns of the pixel electrode 270, is further formed in the pixel region P. In this case, the common electrode 273 is connected to a common line 256 through a common contact hole 265, and the common line 256 is formed parallel to and spaced apart from the gate line 254 on the first passivation layer 240.

Figure 5A:
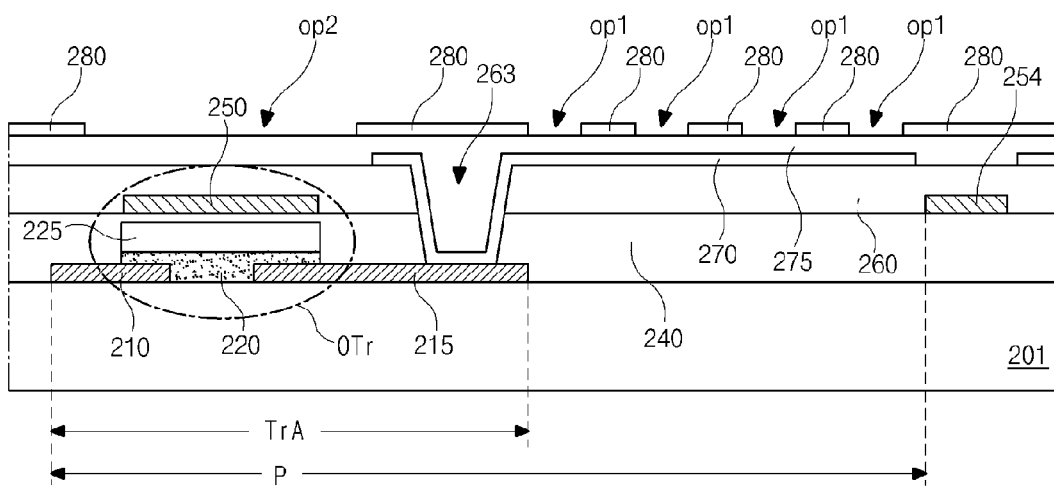
FIG. 5A and FIG. 5B are a cross-sectional view and a plan view of a pixel region of an array substrate including a thin film transistor having an organic semiconductor layer according to another example of the present invention, respectively, and FIG. 5A corresponds to a cross-section taken along the line III-III of FIG. 5B.
Figure 5B:
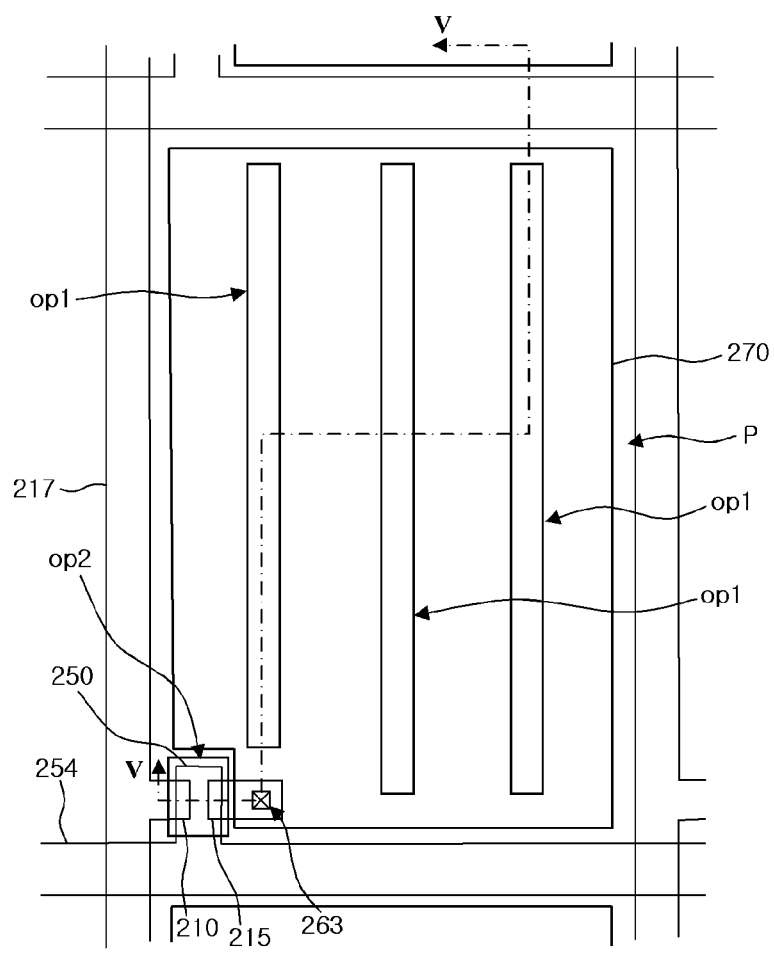

As another example, the array substrate can be applied to a fringe field switching (FFS) mode LCD device. In this case, as shown in FIG. 5A and FIG. 5B, a third passivation layer 275 is further formed on the pixel electrode 270, and a transparent common electrode 280 is further formed on the third passivation layer 275. The common electrode 280 has a plate shape corresponding to the display area and includes first openings op1 of a bar shape in the pixel region P. The common electrode 280, optionally, may have a second opening op2 corresponding to the switching area TrA.

A method of fabricating an array substrate according to an exemplary embodiment of the present invention will be described hereinafter. For some of the embodiments, only the differences from the described method will be explained.

FIGS. 6A to 6M are cross-sectional views of illustrating an array substrate in respective steps of the method of fabricating the same according to the exemplary embodiment of the present invention. For convenience of explanation, an area where a thin film transistor OTr in each pixel region P is formed is referred to as a switching area TrA.

In FIG. 6A, a first metallic layer (not shown) is formed on a transparent insulating substrate 201 by depositing a metallic material having relatively low resistivity, for example, one or more of gold (Au), silver (Ag), aluminum (Al), aluminum alloy such as aluminum neodymium (AlNd), copper (Cu), molybdenum (Mo) or molybdenum titanium (MoTi). The first metallic layer is electrically conductive and may have a single-layered or double-layered structure.

Next, a data line (not shown), a source electrode 210 and a drain electrode 215 are formed through a mask process in which a photoresist pattern (not shown) is formed on the first metallic layer (not shown) by applying photoresist to the first metallic layer, exposing the photoresist to light through a photo mask, and developing the photoresist exposed to light, the first metallic layer is patterned by etching the first metallic layer with the photoresist pattern as an etching mask, and the photoresist pattern is stripped. The data line extends along a direction, and the source and drain electrodes 210 and 215 are disposed in the switching area TrA in the pixel region P. The source electrode 210 is connected to the data line, and the drain electrode 215 is spaced apart from and faces the source electrode 210.

Even though the source and drain electrodes 210 and 215 and the data line have a single-layered structure in the figures, the source and drain electrodes 210 and 215 and the data line may have a multiple-layered structure such as a double-layered or triple-layered structure.

In FIG. 6B, an organic semiconductor material layer 218 is formed on the source and drain electrodes 210 and 215 and the data line (not shown) all over the substrate 201 by applying a liquid-phase organic semiconductor material, for example, pentacene or polythiophene, using an inkjet apparatus, a nozzle coating apparatus, a bar coating apparatus, a slit coating apparatus, a spin coating apparatus or a printing apparatus and then drying the liquid-phase organic semiconductor material, or by thermally depositing a solid-phase or powder-form organic semiconductor material under vacuum conditions.

Subsequently, a gate insulating material layer 222 is formed on the organic semiconductor material layer 218 all over the substrate 201 by applying an organic insulating material, for example, an OGI material, using an inkjet apparatus, a nozzle coating apparatus, a bar coating apparatus, a slit coating apparatus, a spin coating apparatus or a printing apparatus mentioned above.

Figure 6C:
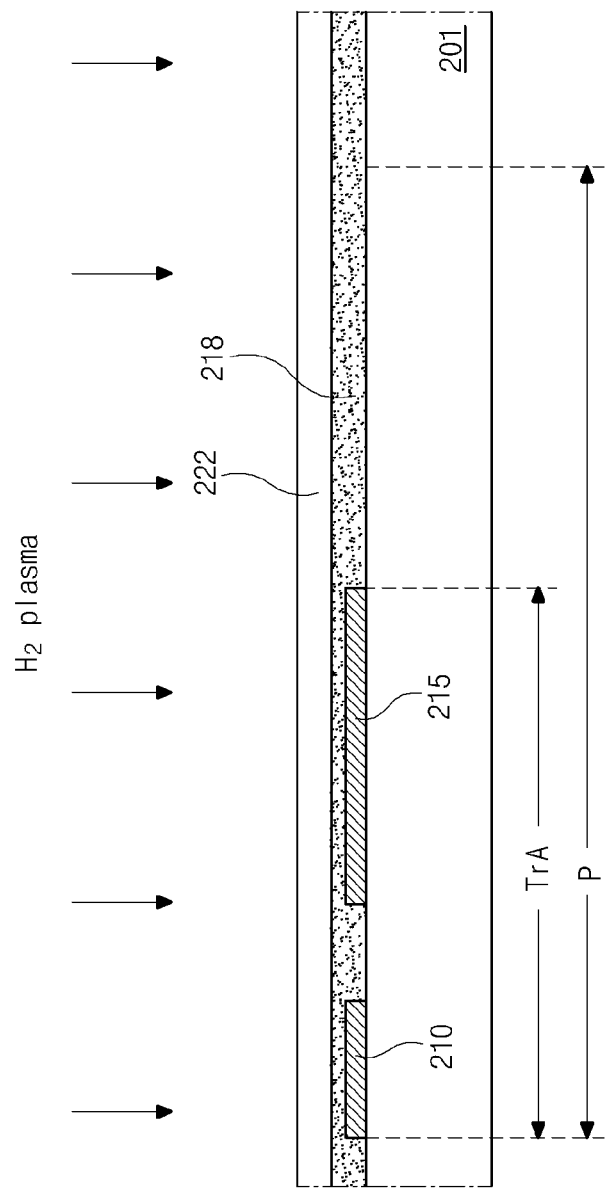

Next, in FIG. 6C, hydrogen ($H_2$) plasma treatment is performed to a surface of the gate insulating material layer 222, and the surface of the gate insulating material layer 222 is improved. This is to increase a contact property between the gate insulating material layer 222 and a photosensitive organic material layer 290 of FIG. 6D, which is formed later, and to cause better adhesion therebetween.

Here, the $H_2$ plasma treatment does not have to be performed and may be omitted as necessary.

Figure 6D:
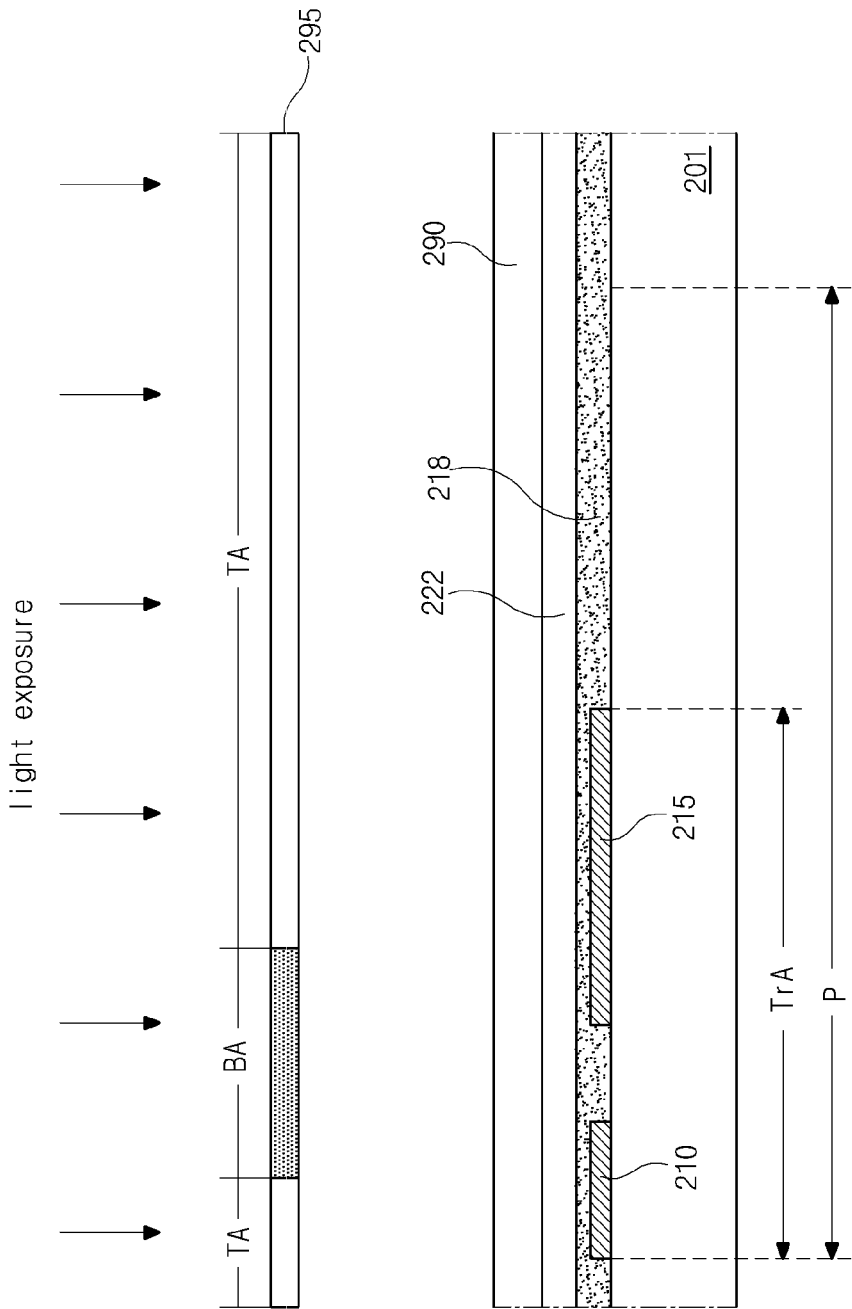

Next, in FIG. 6D, a photosensitive organic material layer 290 is formed on the surface-treated gate insulating material layer 222 by applying an organic material, which is developed by a potassium hydroxide (KOH) aqueous solution, for example, photo acryl.

Then, a photo mask 295 including a light-transmitting portion TA and a light-blocking portion BA is disposed over the photosensitive organic material layer 290, and the photosensitive material layer 290 is exposed to light through the photo mask 295.

In FIG. 6D, the organic material layer 290 may include photo acryl having positive photosensitivity that a portion exposed to light is removed after developing. Alternatively, an organic material having negative photosensitivity that a portion exposed to light remains after developing can be used. In this case, the same result can be obtained if a photo mask including a light-transmitting portion and a light-blocking portion opposite to the photo mask 295 is used.

Figure 6E:
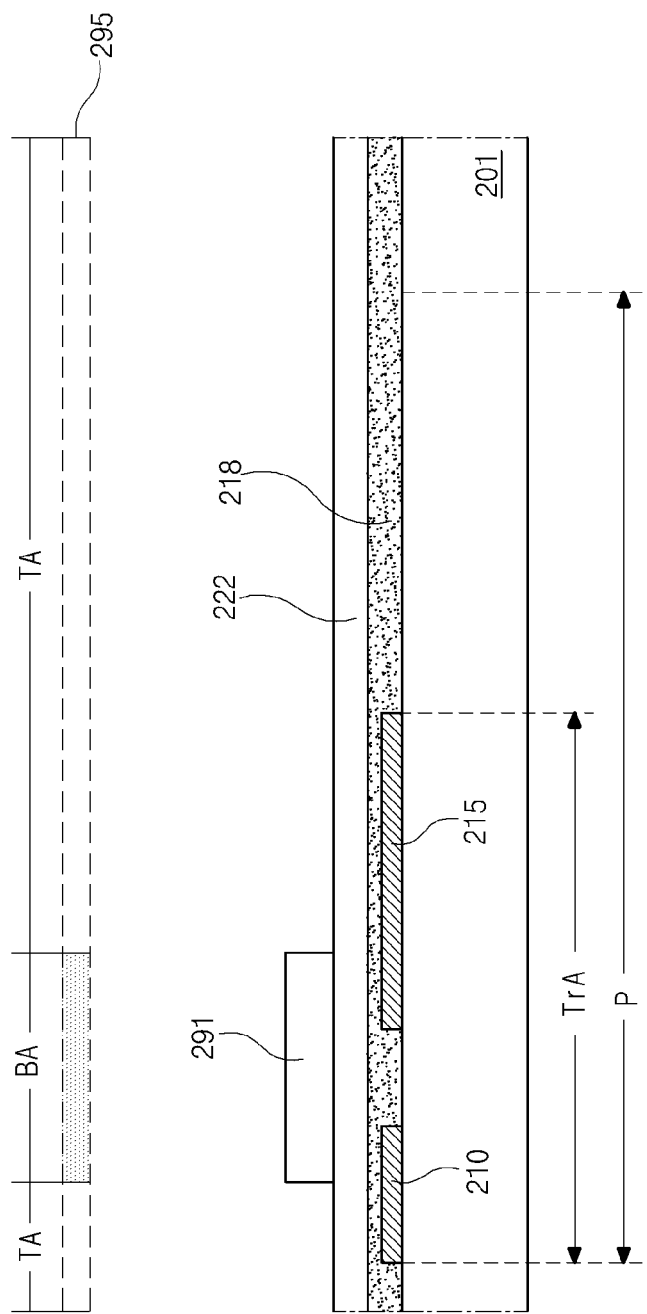

In FIG. 6E, the organic material layer 290 of FIG. 6D exposed to light is exposed to developer including a KOH aqueous solution, and a portion exposed to light reacts with the developer and is removed, thereby forming an organic pattern 291 in the switching area TrA.

The developer including the KOH aqueous solution reacts with only the organic material layer 290 of FIG. 6D and does not react with the gate insulating material layer 222 thereunder. Therefore, the developer does not penetrate the gate insulating material layer 222 to react with the organic semiconductor material layer 218.

Next, in FIG. 6F to FIG. 6H, an organic semiconductor layer 220 and a gate insulating layer 225 are formed in the switching area TrA by sequentially performing dry-etching and removing the gate insulating material layer 222 of FIG. 6E and the organic semiconductor material layer 218 of FIG. 6E using the organic pattern 291 as an etching mask. The organic semiconductor layer 220 contacts the source and drain electrodes 210 and 215 and has an island shape corresponding to an area between the source and drain electrodes 210 and 215. The gate insulating layer 225 has the same plane area as and completely overlaps the organic semiconductor layer 220.

Beneficially, the dry-etching may be anisotropic etching such as reactive ion etching or ion accelerated etching. In the anisotropic dry-etching, the gate insulating material layer 222 and the organic semiconductor material layer 218 of FIG. 6E are highly etched along a vertical direction to the surface of the substrate 201 and they are hardly etched along a parallel direction to the surface of the substrate 201.

Therefore, the gate insulating layer 225 and the organic semiconductor layer 220 formed under the organic pattern 291 do not have an undercut shape, and the gate insulating layer 225 and the organic semiconductor layer 220 have the same plane shape as and completely overlap the organic pattern 291.

When the dry-etching is performed to pattern the gate insulating material layer 222 of FIG. 6E and the organic semiconductor material layer 218 of FIG. 6E, the organic pattern 291 of the photosensitive organic material is also affected by dry-etching, thus, the thickness of the organic pattern 291 is reduced.

Next, dry-etching is further performed to the substrate 201 where the organic semiconductor layer 220 and the gate insulating layer 225 are formed in the switching area TrA, and the organic pattern 291 on the gate insulating layer 225 is totally removed, thereby exposing the gate insulating layer 225. At this time, it is beneficial to remove the improved surface of the gate insulating layer 225 due to the $H_2$ plasma treatment.

Meanwhile, the dry-etching may be performed by using different reactive gases. Namely, to remove the gate insulating material layer 222 of FIG. 6E and the organic semiconductor material layer 218 of FIG. 6E, first dry-etching may be performed using a first reactive gas, which reacts more with the gate insulating material 222 of FIG. 6E and the organic semiconductor material layer 218 of FIG. 6E such that an etch rate for the gate insulating material 222 is faster than that for the organic pattern 291. Then, to remove the organic pattern 291 and expose the gate insulating layer 225, second dry-etching may be performed using a second reactive gas, which reacts more with the organic pattern 291 such that an etch rate for the organic pattern 291 is faster than that for the gate insulating layer 225.

In FIG. 6I, a first passivation layer 240 is formed on the gate insulating layer 225 having an island shape all over the display area by applying the same material as the gate insulating layer 225, that is, the OGI material. The first passivation layer 240 has a flat surface and has a minimum thickness over the gate insulating layer 225. This is to minimize a distance between the organic semiconductor layer 220 and a gate electrode 250 of FIG. 6J, which is formed on the first passivation layer 240 later, because the distance between the organic semiconductor layer 220 and the gate electrode 250 gets longer as the thickness of the first passivation layer 240 becomes thicker.

Next, in FIG. 6J, a second metallic layer (not shown) is formed on the first passivation layer 240 by depositing a metallic material having relatively low resistivity, for example, one or more of gold (Au), silver (Ag), aluminum (Al), aluminum alloy such as aluminum neodymium (AlNd), copper (Cu), molybdenum (Mo) or molybdenum titanium (MoTi). The second metallic layer may have a single-layered or double-layered structure.

Then, the second metallic layer is patterned by performing a mask process to thereby form a gate line 254 and a gate electrode 250. The gate line 254 crosses the data line (not shown) to define the pixel region P. The gate electrode 250 is disposed in the switching area TrA and extends from the gate line 254. The gate electrode 254 corresponds to the gate insulating layer 225 having the island shape.

Here, the source and drain electrodes 210 and 215, the organic semiconductor layer 220, the gate insulating layer 225, the first passivation layer 240 and the gate electrode 250, which are sequentially layered in the switching area TrA, constitute a thin film transistor OTr of a switching element.

Even though the gate line 254 and the gate electrode 250 have a single-layered structure in the exemplary embodiment of the present invention, the gate line 254 and the gate electrode 250 may have a multiple-layered structure such as a double-layered or triple-layered structure.

Meanwhile, in the another example of the array substrate for the IPS mode LCD device of FIG. 4A and FIG. 4B, when the gate line 254 and the gate electrode 250 are formed, a common line 256 is further formed on the first passivation layer 240. The common line 256 is parallel to and spaced apart from the gate line 254.

Figure 6K:
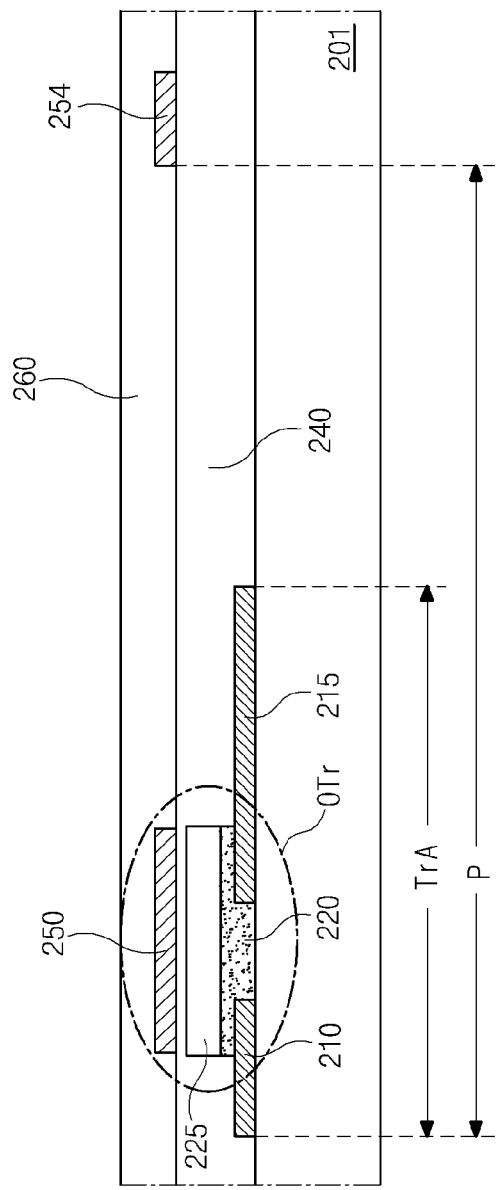

Next, in FIG. 6K, a second passivation layer 260 is formed on the gate line 254 and the gate electrode 250 by applying an organic insulating material having photosensitivity such as photo acryl. The second passivation layer 260 has a flat surface. It is beneficial that the photo acryl may be negative type that a portion exposed to light remains after developing.

Figure 6L:
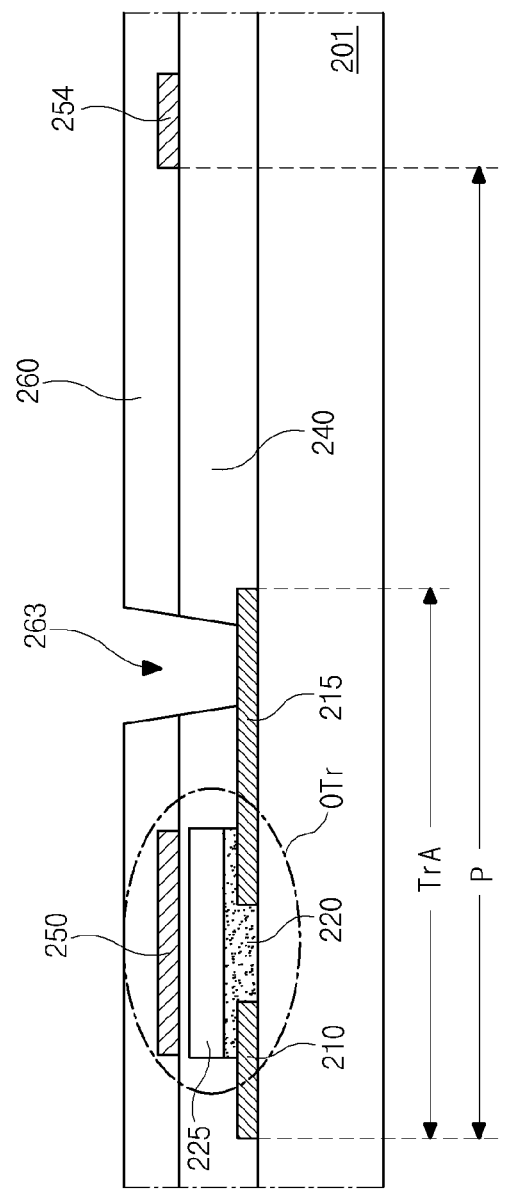

In FIG. 6L, the second passivation layer 260 is exposed to light through a photo mask (not shown) including a light-transmitting portion and a light-blocking portion and then is developed to thereby form a hole (not shown) exposing the first passivation layer 240 corresponding to an upper surface of one end of the drain electrode 215. Subsequently, dry-etching is performed, and the first passivation layer 240 exposed in the hole (not shown) is removed, thereby forming a drain contact hole 263 that exposes the drain electrode 215.

At this time, in an example of the array substrate for the IPS mode LCD device of FIGS. 4A and 4B, where the gate line 254 and the common line 256 are formed parallel to each other in the display area, a common contact hole 265 exposing the common line 256 may be further formed in the pixel region P in addition to the drain contact hole 263.

Figure 6M:
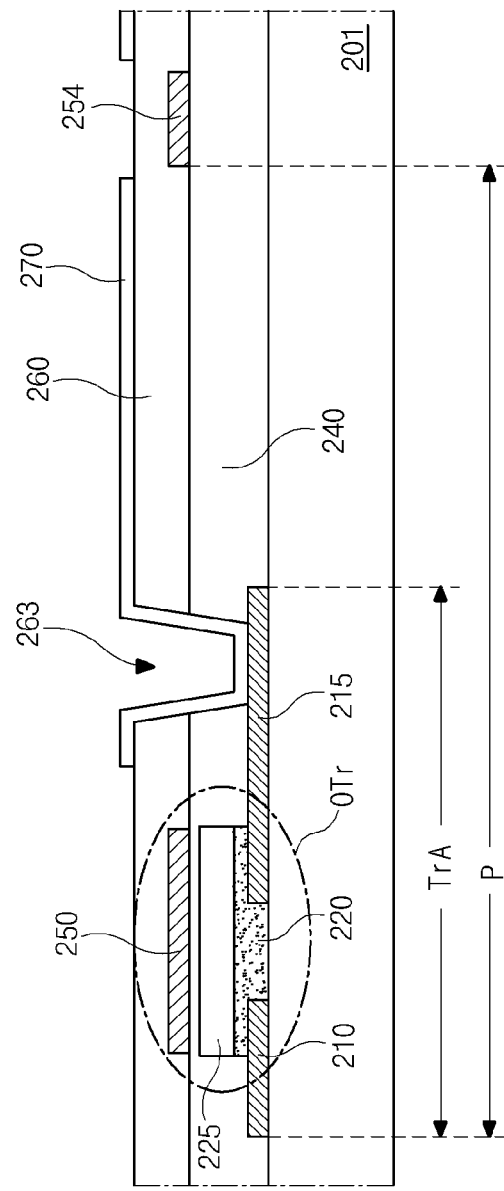

In FIG. 6M, a transparent conductive material layer (not shown) is formed on the second passivation layer 260 having the drain contact hole 263 by depositing a transparent conductive material, for example, indium tin oxide (ITO) or indium zinc oxide (IZO).

Then, the transparent conductive material layer is patterned through a mask process, thereby forming a pixel electrode 270. The pixel electrode 270 has a plate shape and contacts the drain electrode 215 through the drain contact hole 263.

Meanwhile, in fabricating the array substrate for the IPS mode LCD device, referring to FIG. 4A and FIG. 4B, during the step of forming the pixel electrode 270, the pixel electrode 270 including bar-shaped patterns and the common electrode 273 including bar-shaped patterns are formed in the pixel electrode P. The patterns of the pixel electrode 270 and the patterns of the common electrode 273 alternate each other. One ends of the patterns of the pixel electrode 270 are connected to each other. The common electrode 273 contacts the common line 256 through the common contact hole 265. At this time, the pixel electrode 270 and the common electrode 273 may be formed of an opaque metallic material, for example, one or more of molybdenum (Mo), molybdenum titanium (MoTi), aluminum (Al), aluminum alloy and copper (Cu). The pixel electrode 270 and the common electrode 273 may have a single-layered structure or a multiple-layered structure.

In fabricating the array substrate for the FFS mode LCD device, referring to FIG. 5A and FIG. 5B, a third passivation layer 275 is formed on the pixel electrode 270 having a plate shape by applying an organic insulating material. A transparent common electrode 280 is formed on the third passivation layer 275 all over the display area by depositing a transparent conductive material and then is patterned to thereby form first openings op1 of a bar shape corresponding to the pixel electrode 270 in the pixel region P.

At this time, the common electrode 280 may be further formed to include a second opening op2 corresponding to the switching area TrA. If the common electrode 280 overlaps the thin film transistor OTr, a parasitic capacitance is caused, and the characteristics of the thin film transistor OTr is lowered due to the parasitic capacitance. Therefore, this is prevented by forming the second opening op2.

In the array substrate for the FFS mode LCD device, it is beneficial that the pixel electrode 270 and the common electrode 280 are formed of a transparent conductive material.

Figure 1:
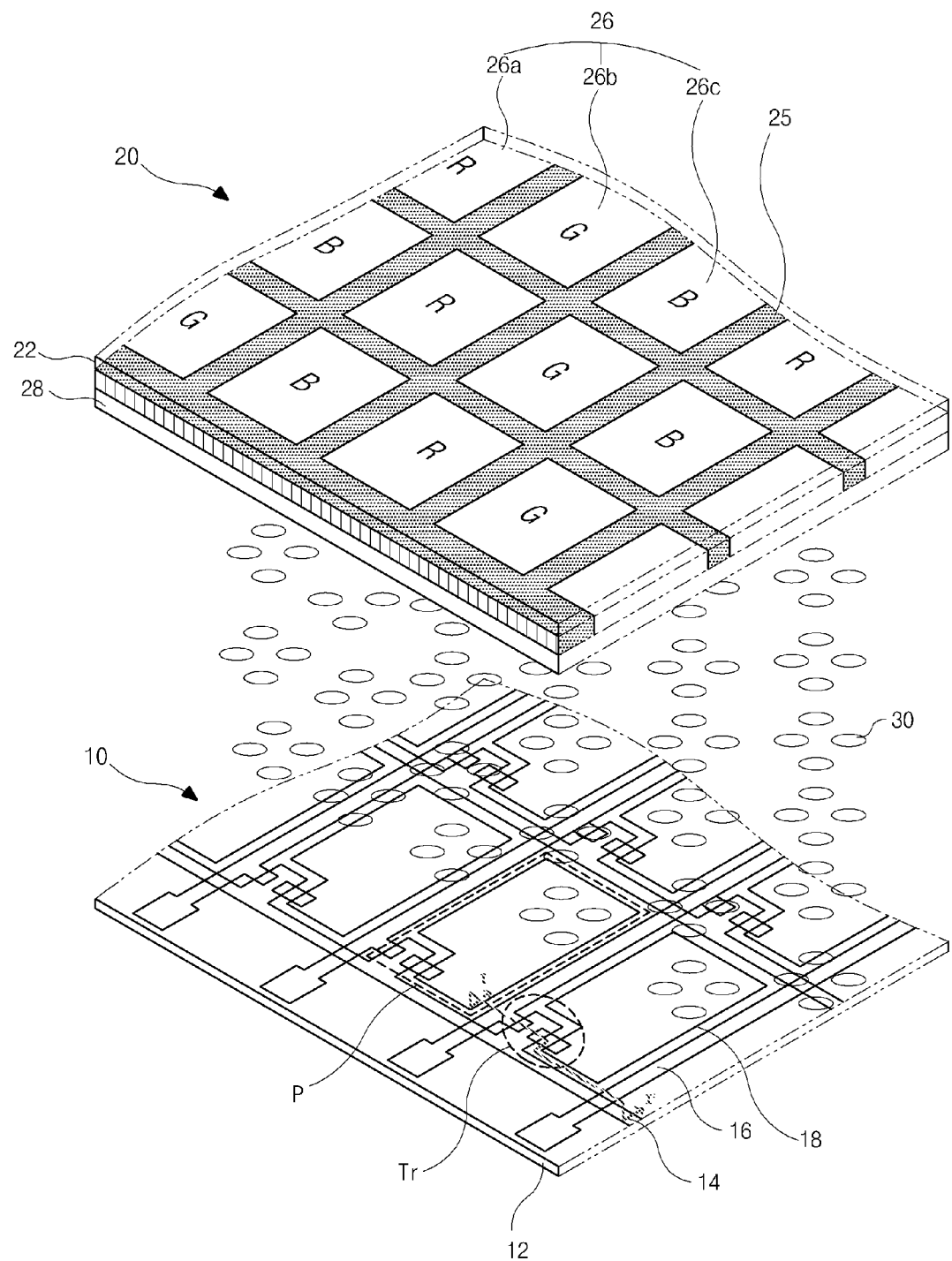
FIG. 1 is an exploded perspective view of an LCD device, which is one of the flat panel display devices.
Figure 2:
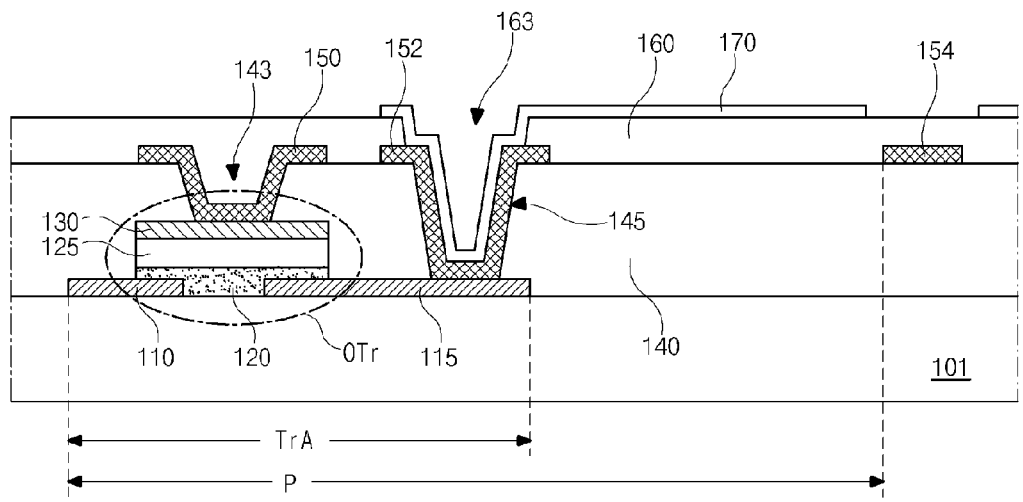
FIG. 2 is a cross-sectional view of a pixel region of an array substrate including a thin film transistor having an organic semiconductor layer of the related art.

In the present invention, the array substrate includes the organic semiconductor layer 220 and also includes one gate electrode 250 corresponding to the organic semiconductor layer 220. Accordingly, as compared with the array substrate of the related art of FIG. 2 that includes two gate electrodes formed on different layers of, costs for materials can be decreased, and a step for forming the first gate electrode is omitted, thereby simplifying the manufacturing processes.

Figure 7:
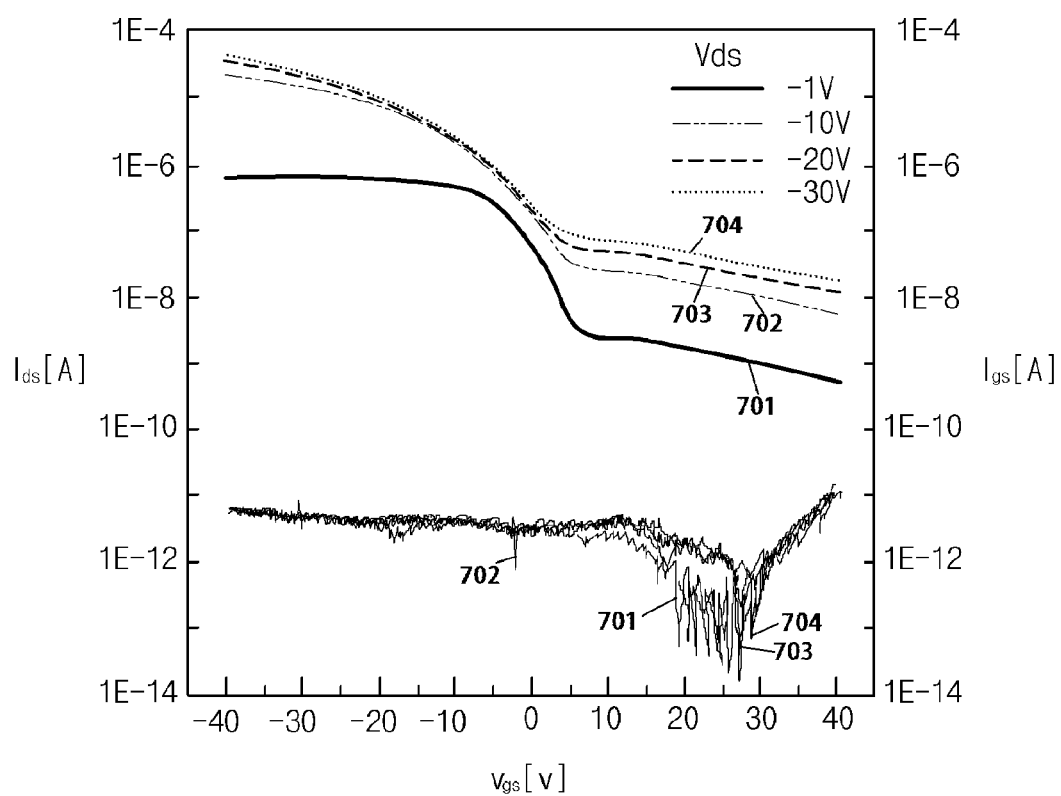
FIG. 7 is a graph of illustrating voltage-current characteristics of a thin film transistor having an organic semiconductor layer of an array substrate according to the present invention.

FIG. 7 is a graph of illustrating voltage-current characteristics of a thin film transistor having an organic semiconductor layer of an array substrate according to the present invention. FIG. 7 shows drain currents Ids (relating the left axis and upper four curves) versus gate voltages depending on voltage difference Vds between source and drain electrodes −1V (701), −10V (702), −20V (703), and −30V (704) and leakage currents Igs (relating the right axis and lower four curves) via the gate insulating layer.

In FIG. 7, when the thin film transistor turns ON, that is, the gate voltage Vgs varies from −40V to 0V, the drain currents $I_{ds}$ are about $10^{-4}$ A at −10V, −20V and −30V between the source and drain electrodes, and an on/off ratio of the drain currents, namely, $I_{on}/I_{off}$ is about $10^4$ A. In addition, the drain current $I_{ds}$ linearly decreases in a certain section when the gate voltage $V_{gs}$ changes, and the drain current $I_{ds}$ stably gradually decreases without irregular marks with respect to the gate voltage $V_{gs}$ having specific values.

When a voltage is not applied between the source and drain electrodes and leakage current via the gate insulating layer is measured with respect to a change of the gate voltage $V_{gs}$, the measured leakage current $I_{gs}$ may be $10^{-11}$ A to $10^{-14}$ A. The leakage current may be satisfactory.

In the present invention, the array substrate includes the organic semiconductor layer and also includes one gate electrode. Accordingly, as compared with the array substrate of the related art including two gate electrodes formed on different layers, costs for materials can be decreased, and a step for forming the first gate electrode, which is not directly connected to the gate line, is omitted, thereby simplifying the manufacturing processes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of an array substrate, comprising:
   forming a conductive material on a substrate and forming source and drain electrodes by etching the conductive material in a pixel region on the substrate;
   forming an organic semiconductor layer and a gate insulating layer on the substrate including the source and drain electrodes,
   forming a photosensitive organic material layer on the gate insulating layer,
   forming the organic semiconductor layer into an island shape that contacts facing ends of the source and drain electrodes by etching the organic semiconductor layer and the gate insulating layer, the gate insulating layer having the island shape;
   forming a first passivation layer on the gate insulating layer over all of a display area of the substrate;
   forming a gate electrode on the first passivation layer in the pixel region, the gate electrode corresponding to the gate insulating layer, wherein a portion of the first passivation layer is disposed between the gate insulating layer and the gate electrode and is in direct contact with an entire top surface of the gate insulating layer;
   forming a second passivation layer on the gate electrode all over the display area, the second passivation layer having a drain contact hole exposing the drain electrode; and
   forming a pixel electrode on the second passivation layer, the pixel electrode contacting the drain electrode through the drain contact hole.

2. The method according to claim 1, wherein forming the organic semiconductor layer and the gate insulating layer includes:
   after forming the photosensitive organic material layer on the gate insulating layer, forming an organic insulating pattern in the pixel region by light-exposing and developing the photosensitive organic material layer;
   removing a gate insulating material layer and an organic semiconductor material layer exposed outside of the organic insulating pattern by performing first dry-etching using the organic insulating pattern as an etching mask, thereby forming the organic semiconductor layer and the gate insulating layer into the island shape in the pixel region, wherein the organic semiconductor layer and the gate insulating layer overlap each other; and
   removing the organic insulating pattern.

3. The method according to claim 2, wherein the first dry-etching is anisotropy etching for the organic semiconductor layer and the gate insulating layer overlapping each other.

4. The method according to claim 2, wherein the organic insulating pattern is removed by the first dry-etching or by second dry-etching in which etching gas is different from that of the first dry-etching.

5. The method according to claim 2, further comprising a step of performing hydrogen plasma treatment to a surface of the gate insulating material layer after forming the gate insulating material layer and before forming the photosensitive organic material layer, thereby improving adhesion between the gate insulating material layer and the photosensitive organic material layer.

6. The method according to claim 2, wherein the first passivation layer includes a same material as the gate insulating layer to minimize a thickness of the portion of the first passivation layer between the gate electrode and the gate insulating layer.

7. The method according to claim 1, wherein the organic semiconductor layer includes pentacene or polythiophene, the second passivation layer includes photo acryl, and the gate insulating layer and the first passivation layer includes at least one of PI (polyimide), PVP (Poly 4-vinylphenol), PVA (Polyvinyl alcohol), PMMA (poly(methyl methacrylate)), BCB (benzocyclobutene), Polypropylene and an OGI (organic gate insulator) material expressed by the following structural formula:

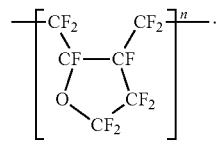

8. The method according to claim 1, wherein forming the source and drain electrodes includes forming a data line connected to the source electrode, and forming the gate electrode includes forming a gate line that is connected to the gate electrode and crosses the data line to define the pixel region.

9. The method according to claim 8, wherein forming the gate line includes forming a common line spaced apart from and parallel to the gate line,
forming the second passivation layer includes forming a common contact hole exposing the common line, and
forming the pixel electrode includes forming a common electrode connected to the common line through the common contact hole, wherein the pixel electrode includes bar-shaped patterns, and the common electrode includes bar-shaped patterns alternating the patterns of the pixel electrode in the pixel region.

10. The method according to claim 8, further comprising:
forming a third passivation layer on the pixel electrode; and
forming a common electrode on the third passivation layer all over the display area, the common electrode having a plate shape corresponding to the display area and including openings of a bar shape in the pixel region.

11. An array substrate comprising:
source and drain electrodes in a pixel region on a substrate on which a display area including the pixel region is defined;
an organic semiconductor layer and a gate insulating layer on and between the source and drain electrodes, the organic semiconductor layer having an island shape and contacting facing ends of the source and drain electrodes, the gate insulating layer having a same plane shape as the organic semiconductor layer;
a first passivation layer on the gate insulating layer over all of the display area;
a gate electrode on the first passivation layer in the pixel region, the gate electrode corresponding to the gate insulating layer;
a second passivation layer on the gate electrode and over all of the display area, the second passivation layer having a drain contact hole exposing the drain electrode; and
a pixel electrode on the second passivation layer, the pixel electrode contacting the drain electrode through the drain contact hole,
wherein a portion of the first passivation layer is disposed between the gate insulating layer and the gate electrode and is in direct contact with an entire top surface of the gate insulating layer.

12. The array substrate according to claim 11, wherein the organic semiconductor layer includes pentacene or polythiophene, the second passivation layer includes photo acryl, and the gate insulating layer and the first passivation layer includes at least one of PI (polyimide), PVP (Poly 4-vinylphenol), PVA (Polyvinyl alcohol), PMMA (poly(methyl methacrylate)), BCB (benzocyclobutene), Polypropylene and an OGI (organic gate insulator) material expressed by the following structural formula:

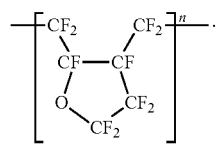

13. The array substrate according to claim 11, further comprising a data line on the substrate and connected to the source electrode and a gate line on the first passivation layer and connected to the gate electrode, wherein the gate line crosses the data line to define the pixel region.

14. The array substrate according to claim 11, further comprising:
a common line on the first passivation layer and spaced apart from and parallel to the gate line; and
a common electrode on the second passivation layer in the pixel region,
wherein the second passivation layer includes a common contact hole exposing the common line, the pixel electrode includes bar-shaped patterns in the pixel region, and the common electrode contacts the common line through the common contact hole and includes bar-shaped patterns alternating with the patterns of the pixel electrode.

15. The array substrate according to claim 11, further comprising:
a third passivation layer on the pixel electrode all over the display area; and
a common electrode on the third passivation layer over all of the display area, the common electrode having a plate shape corresponding to the display area and including openings of a bar shape in the pixel region.

* * * * *